United States Patent [19]

Fontana et al.

[11] Patent Number: 5,528,440
[45] Date of Patent: Jun. 18, 1996

[54] SPIN VALVE MAGNETORESISTIVE ELEMENT WITH LONGITUDINAL EXCHANGE BIASING OF END REGIONS ABUTTING THE FREE LAYER, AND MAGNETIC RECORDING SYSTEM USING THE ELEMENT

[75] Inventors: Robert E. Fontana, San Jose; Tsann Lin, Campbell; Ching H. Tsang, Sunnyvale, all of Calif.

[73] Assignee: International Business Machines Corporation, Armonk, N.Y.

[21] Appl. No.: 280,967

[22] Filed: Jul. 26, 1994

[51] Int. Cl.$^6$ .............................. G11B 5/39; H01L 43/08; G01R 33/02
[52] U.S. Cl. .................. 360/113; 338/32 R; 324/252
[58] Field of Search .................. 360/113; 338/32 R; 324/252, 207.21

[56] References Cited

U.S. PATENT DOCUMENTS

| | | | |
|---|---|---|---|
| 4,949,039 | 8/1990 | Grunberg | 324/252 |
| 5,159,513 | 10/1992 | Dieny et al. | 360/113 |
| 5,206,590 | 4/1993 | Dieny et al. | 324/252 |
| 5,287,238 | 2/1994 | Baumgart et al. | 360/113 |
| 5,329,413 | 7/1994 | Kondoh et al. | 360/113 |
| 5,436,778 | 7/1995 | Lin et al. | 360/113 |

OTHER PUBLICATIONS

Binasch et al., "Enhanced Magnetoresistance in Layered Magnetic Structures with Antiferromagnetic Interlayer Exchange", Physical Review B, vol. 39, No. 7, Mar. 1, 1989, pp. 4828–4830.
Dieny et al., "Change in Conductance is the Fundamental Measure of Spin–Valve Magnetoresistance", Applied Physics Letters, vol. 61, No. 17, Oct. 26, 1992, pp. 2111–2113.
Dieny, "Quantitative Interpretation of Giant Magnetoresistance Properties of Permalloy-based Spin–Valve Structures", Europhysics Letters, vol. 17, No. 3, Jan. 14, 1992, pp. 261–267.
Dieny, "Classical Theory of Giant Magnetoresistance in Spin–Valve Multilayers: Influence of Thicknesses, Number of Periods, Bulk and Interfacial Spin–dependent Scattering", Journal of Physics:Condensed Matter, vol. 4, 1992, pp. 8009–8020.
Dieny et al., "Giant Magnetoresistance in Soft Ferromagnetic Multilayers", Physical Review B, vol. 43, No. 1, Jan. 1, 1991, pp. 1297–1300.
Levy, "Giant Magnetoresistance in Magnetic Layered and Granular Materials", Science, vol. 256, May 15, 1992, pp. 972–973.
Parkin et al., "Giant Magnetoresistance in Antiferromagnetic Co/Cu Multilayers", Applied Physics Letters, vol. 58, No. 23, Jun. 10, 1991, pp. 2710–2712.

(List continued on next page.)

*Primary Examiner*—Stuart S. Levy
*Assistant Examiner*—Brian E. Miller
*Attorney, Agent, or Firm*—Thomas R. Berthold

[57] ABSTRACT

An improved spin valve (SV) magnetoresistive element has its free ferromagnetic layer in the form of a central active region with defined edges and end regions that are contiguous with and abut the edges of the central active region. A layer of antiferromagnetic material, preferably a nickel-manganese (Ni—Mn) alloy, is formed on and in contact with the ferromagnetic material in the end regions for exchange coupling with the end regions to provide them with a longitudinal bias of their magnetizations. The pinned ferromagnetic layer in the SV element is pinned by exchange coupling with a different layer of antiferromagnetic material, preferably an iron-manganese (Fe—Mn) alloy. This material has a substantially different Neel temperature from that of the antiferromagnetic material on the end regions. The process for making the SV element includes heating to different predetermined temperatures in the presence of an applied magnetic field to orient the magnetizations of the free and pinned layers in the proper direction. The SV element may be used as a sensor for reading data in magnetic recording systems.

9 Claims, 6 Drawing Sheets

OTHER PUBLICATIONS

Parkin et al., "Spin Engineering: Direct Determination of the Ruderman–Kittel–Kasuya–Yosida Far–field Range Function in Ruthenium", Physical Review B, vol. 44, No. 13, Oct. 1, 1991, pp. 7131–7134.

Parkin et al., "Oscillations in Exchange Coupling and Magnetoresistance in Metallic Superlattice Structures: Co/Ru, Co/Cr, and Fe/Cr", Physical Review Letters, vol. 64, No. 19, May 7, 1990, pp. 2304–2307.

Parkin et al., "Oscillatory Magnetic Exchange Coupling Through Thin Copper Layers", Physical Review Letters, vol. 66, No. 16, Apr. 22, 1991, pp. 2152–2155.

Parkin, "Systematic Variation of the Strength and Oscillation Period of Indirect Magnetic Exchange Coupling through the 3d, 4d, and 5d Transition Metals", Physical Review Letters, vol. 67, No. 25, Dec. 16, 1991, pp. 3598–3601.

Parkin, "Giant Magnetoresistance and Oscillatory Interlayer Exchange Coupling in Copper Based Multilayers", Materials Research Society Symposium Proceedings, vol. 231, 1992, pp. 211–216.

Pennisi, "Magnetic Advantage: Magnetic Fields Make New Thin Films Better Conductors", Science News, vol. 142, Aug. 29, 1992, pp. 140–142.

SPIN VALVE MAGNETORESISTIVE ELEMENT WITH LONGITUDINAL EXCHANGE BIASING OF END REGIONS ABUTTING THE FREE LAYER, AND MAGNETIC RECORDING SYSTEM USING THE ELEMENT

RELATED APPLICATION

This application is related to copending application Ser. No. 08/090,714, filed Jul. 13, 1993.

TECHNICAL FIELD

This invention relates to a magnetoresistive (MR) sensor based on the spin valve effect for sensing magnetic fields, to a process for making the sensor, and to a magnetic recording system which incorporates such a sensor.

BACKGROUND OF THE INVENTION

An MR sensor detects magnetic field signals through the resistance changes of a read element, fabricated of a magnetic material, as a function of the strength and direction of magnetic flux being sensed by the read element. The conventional MR sensor operates on the basis of the anisotropic magnetoresistive (AMR) effect in which a component of the read element resistance varies as the square of the cosine of the angle between the magnetization in the read element and the direction of sense current flow through the read element. Recorded data can be read from a magnetic medium because the external magnetic field from the recorded magnetic medium (the signal field) causes a change in the direction of magnetization in the read element, which in turn causes a change in resistance in the read element and a corresponding change in the sensed current or voltage.

A different and more pronounced magnetoresistance, called giant magnetoresistance (GMR), has been observed in a variety of magnetic multilayered structures, the essential feature being at least two ferromagnetic metal layers separated by a nonferromagnetic metal layer. This GMR effect has been found in a variety of systems, such as Fe/Cr or Co/Cu multilayers exhibiting strong antiferromagnetic coupling of the ferromagnetic layers, as well as in essentially uncoupled layered structures in which the magnetization orientation in one of the two ferromagnetic layers is fixed or pinned. The physical origin is the same in all types of structures: the application of an external magnetic field causes a variation in the relative orientation of the magnetizations of neighboring ferromagnetic layers. This in turn causes a change in the spin-dependent scattering of conduction electrons and thus the electrical resistance of the structure. The resistance of the structure thus changes as the relative alignment of the magnetizations of the ferromagnetic layers changes.

A particularly useful application of GMR is a sandwich structure comprising two essentially uncoupled ferromagnetic layers separated by a nonmagnetic metallic spacer layer in which the magnetization of one of the ferromagnetic layers is "pinned". The pinning may be achieved by depositing the ferromagnetic layer to be pinned onto an antiferromagnetic iron-manganese (Fe—Mn) layer so that these two adjacent layers are exchange coupled. The unpinned or "free" ferromagnetic layer may also have the magnetization of its extensions (those portions of the free layer on either side of the central active sensing region) also fixed, but in a direction perpendicular to the magnetization of the pinned layer so that only the magnetization of the free-layer central active region is free to rotate in the presence of an external field. The magnetization in the free-layer extensions may also be fixed by exchange coupling to an antiferromagnetic layer. However, the antiferromagnetic material used for this must be different from the Fe—Mn antiferromagnetic material used to pin the pinned layer. The resulting structure is a spin valve (SV) magnetoresistive sensor in which only the free ferromagnetic layer is free to rotate in the presence of an external magnetic field. U.S. Pat. No. 5,159,513, assigned to IBM, discloses a SV sensor in which at least one of the ferromagnetic layers is of cobalt or a cobalt alloy, and in which the magnetizations of the two ferromagnetic layers are maintained substantially perpendicular to each other at zero externally applied magnetic field by exchange coupling of the pinned ferromagnetic layer to an antiferromagnetic layer. U.S. Pat. No. 5,206,590, also assigned to IBM, discloses a basic SV sensor wherein the free layer is a continuous film having a central active region and end regions. The end regions of the free layer are exchange biased by exchange coupling to one type of antiferromagnetic material, and the pinned layer is pinned by exchange coupling to a different type of antiferromagnetic material. The SV sensor described in the '590 patent has the disadvantage that it is difficult to fabricate. If subtractive processing techniques are used, it is difficult to precisely remove the top layers of the sensor down to the free layer without damaging or thinning the free layer. Also, the free layer may be a combination of several layers, including very thin layers only several angstroms in thickness, and the top layers of the free-layer structure may be damaged during the removal process. If additive processing is used, it is no longer possible to deposit the entire spin valve layers in one vacuum cycle so that the integrity of the interface between the free layer and the spacer layer becomes compromised.

The copending '714 application describes an AMR sensor wherein the MR element has discontinuous end regions abutting the central sensing region with the end regions being longitudinally biased by antiferromagnetic layers.

What is needed is a SV sensor having a free ferromagnetic layer with improved end regions for coupling to the antiferromagnetic layer.

SUMMARY OF THE INVENTION

The invention is an improved SV sensor, a process for making the sensor, and a magnetic recording system incorporating the sensor. The free ferromagnetic layer in the SV sensor is present only in the central active sensing region of the sensor. It has defined edges that abut the end regions. The end regions are formed of a ferromagnetic layer and an antiferromagnetic layer. The ferromagnetic layers in the end regions are distinct from the free layer in the central active region of the sensor. These ferromagnetic layers need not be identical in composition, thickness, or magnetic moment. The layer of antiferromagnetic material, preferably a nickel-manganese (Ni—Mn) alloy, is formed on and in contact with the ferromagnetic material in the end regions for exchange coupling with the end regions to provide them with a longitudinal bias of their magnetizations. The pinned ferromagnetic layer in the SV sensor is pinned by exchange coupling with a different layer of antiferromagnetic material, preferably an iron-manganese (Fe—Mn) alloy. This material has a substantially different Neel temperature from that of the antiferromagnetic material on the end regions.

In the process for making the sensor, the layers making up the central sensing region are pattern etched to define the central sensing region with the defined track width. Additional ferromagnetic material is then deposited on the substrate to the sides of the free layer central region in a manner to abut the edges of the free layer central region. A layer of Ni—Mn is deposited on the ferromagnetic material in the end regions. The sensor is then heated in an annealing oven in the presence of an applied magnetic field to a temperature that allows the Ni—Mn magnetization to be fixed and aligned with the magnetizations of the ferromagnetic end regions. After cooling, the sensor is rotated 90 degrees in the oven and heated above the Neel temperature of the Fe—Mn to fix the magnetization of the Fe—Mn to be aligned with the magnetization of the pinned ferromagnetic layer.

For a fuller understanding of the nature and advantages of the present invention, reference should be made to the following detailed description taken together with the accompanying figures.

DETAILED DESCRIPTION OF THE INVENTION PRIOR ART

Figure 1:
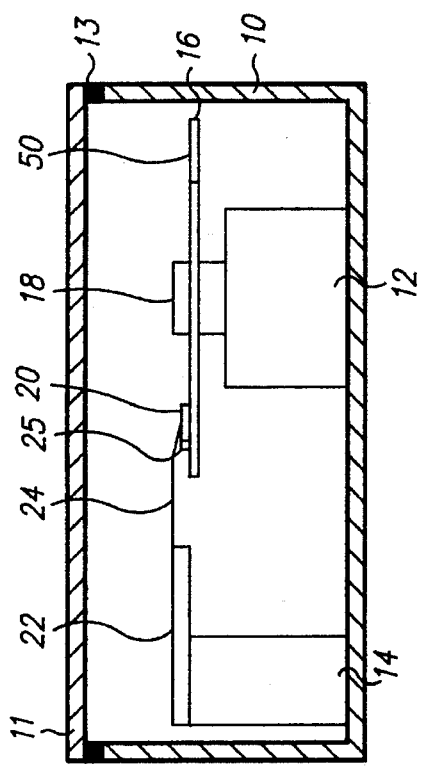
FIG. 1 is a simplified block diagram of a magnetic recording disk drive for use with the SV sensor according to the present invention.

Although the SV sensor of the present invention will be described as embodied in a magnetic recording disk drive, as shown in FIG. 1, the invention is also applicable to other magnetic recording systems, such as a magnetic tape recording system, and to magnetic random access memory systems wherein a magnetoresistive element serves as a bit cell.

Referring to FIG. 1, there is illustrated in sectional view a schematic of a prior art disk drive of the type using an MR sensor. The disk drive comprises a base 10 to which are secured a disk drive motor 12 and an actuator 14, and a cover 11. The base 10 and cover 11 provide a substantially sealed housing for the disk drive. Typically, there is a gasket 13 located between base 10 and cover 11 and a small breather port (not shown) for equalizing pressure between the interior of the disk drive and the outside environment. A magnetic recording disk 16 is connected to drive motor 12 by means of hub 18 to which it is attached for rotation by the drive motor 12. A thin lubricant film 50 is maintained on the surface of disk 16. A read/write head or transducer 25 is formed on the trailing end of a carrier, such as an air-bearing slider 20. Transducer 25 may be an inductive read and write transducer or an inductive write element with a SV read element of the type to be described. The slider 20 is connected to the actuator 14 by means of a rigid arm 22 and a suspension 24. The suspension 24 provides a biasing force which urges the slider 20 onto the surface of the recording disk 16. During operation of the disk drive, the drive motor 12 rotates the disk 16 at a constant speed, and the actuator 14, which is typically a linear or rotary voice coil motor (VCM), moves the slider 20 generally radially across the surface of the disk 16 so that the read/write head may access different data tracks on disk 16.

Figure 2:
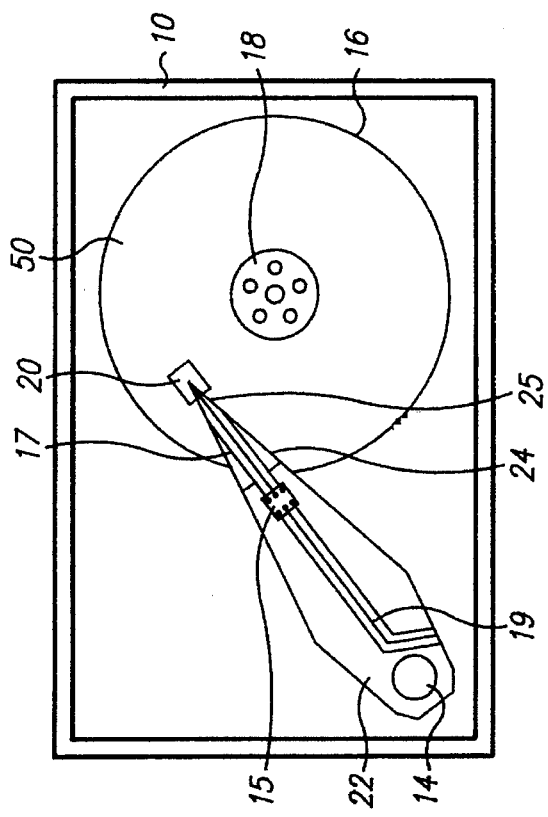
FIG. 2 is a top view of the disk drive of FIG. 1 with the cover removed.

FIG. 2 is a top view of the interior of the disk drive with the cover 11 removed, and illustrates in better detail the suspension 24 which provides a force to the slider 20 to urge it toward the disk 16. The suspension may be a conventional type of suspension such as the well-known Watrous suspension, as described in IBM's U.S. Pat. No. 4,167,765. This type of suspension also provides a gimbaled attachment of the slider which allows the slider to pitch and roll as it rides on the air bearing. The data detected from disk 16 by the transducer 25 is processed into a data readback signal by signal amplification and processing circuitry in the integrated circuit chip 15 located on arm 22. The signals from transducer 25 travel via flex cable 17 to chip 15, which sends its output signals via cable 19.

The above description of a typical magnetic recording disk drive, and the accompanying FIGS. 1 and 2, are for representation purposes only. It should be apparent that disk drives may contain a large number of disks and actuators, and each actuator may support a number of sliders. In addition, instead of an air-bearing slider, the head carrier may be one which maintains the head in contact or near contact with the disk, such as in liquid bearing and other contact recording disk drives.

Figure 3:
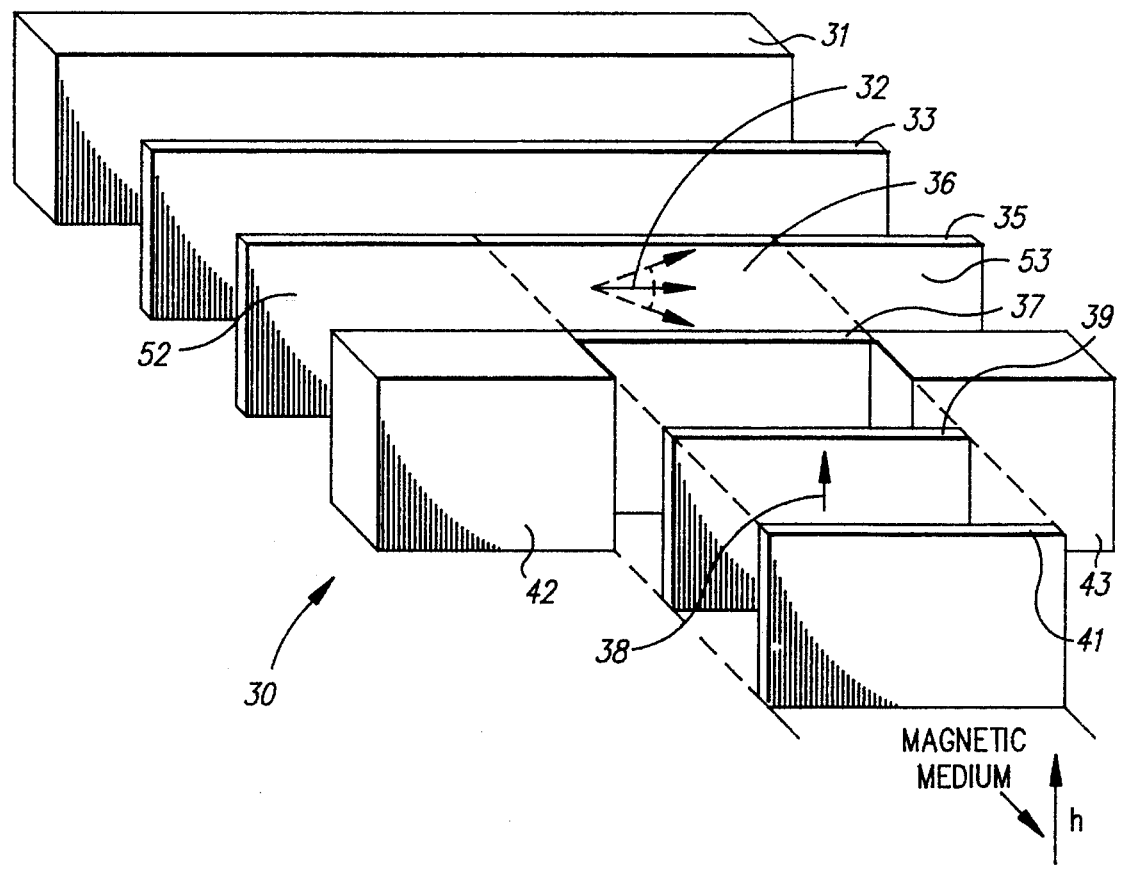
FIG. 3 is an exploded perspective view of a prior art SV sensor showing the continuous free layer with its end regions exchange coupled to an antiferromagnetic layer.

A prior art SV sensor 30 is shown in FIG. 3. The films forming the completed sensor are supported on a suitable substrate 31. The SV sensor 30 may form part of transducer 25 in the disk drive system of FIGS. 1 and 2, and the substrate 31 may be the trailing end of the head carrier or slider 20.

An underlayer or buffer layer 33 is deposited on substrate 31, followed by a first thin layer 35 of soft ferromagnetic material. A thin nonferromagnetic metallic spacer layer 37, a second thin layer 39 of ferromagnetic material, and a thin layer 41 of an exchange biasing material having relatively high electrical resistance and being in direct contact with the ferromagnetic layer 39 are deposited over ferromagnetic layer 35. Layers 37, 39, 41 are then etched away at their end regions to have a predetermined width generally corresponding to the width of the data track on the magnetic medium, such as disk 16. Antiferromagnetic layers 42, 43 are then formed directly on the extensions 52, 53 on the sides of central active sensing region 36 of ferromagnetic layer 35. Not shown in FIG. 3 are the capping layer for corrosion protection and the electrical leads that are patterned on layers 42, 43.

In the absence of an externally applied magnetic field from the recorded magnetic disk 16, the magnetizations of the two layers 35, 39 of ferromagnetic material are oriented at an angle, preferably of about 90 degrees, with respect to each other, as indicated by arrows 32 and 38, respectively. The ferromagnetic layer 35 is called the "free" ferromagnetic layer in that the magnetization in its central region 36 is free to rotate its direction in response to an externally applied magnetic field (such as magnetic field h as shown in FIG. 3), as shown by the dashed arrows on layer 35. The ferromagnetic layer 39 is called the "pinned" ferromagnetic layer because its magnetization direction is fixed or pinned in a preferred orientation, as shown by the arrow 38. Layer 41 provides a biasing field by exchange coupling and thus pins the magnetization of the ferromagnetic layer 39 in a preferred direction (arrow 38) so that it cannot rotate its direction in the presence of an applied external magnetic field having a strength in the range of the signal field from disk 16. Similarly, the layers 42, 43 provide longitudinal biasing by exchange coupling to the extensions 52, 53 of the free ferromagnetic layer 35. This assures that the magnetization of the central sensing region 36 of the free ferromagnetic layer 35 is maintained generally perpendicular to the magnetization of pinned ferromagnetic layer 39 in the absence of an externally applied magnetic field.

Figure 4:
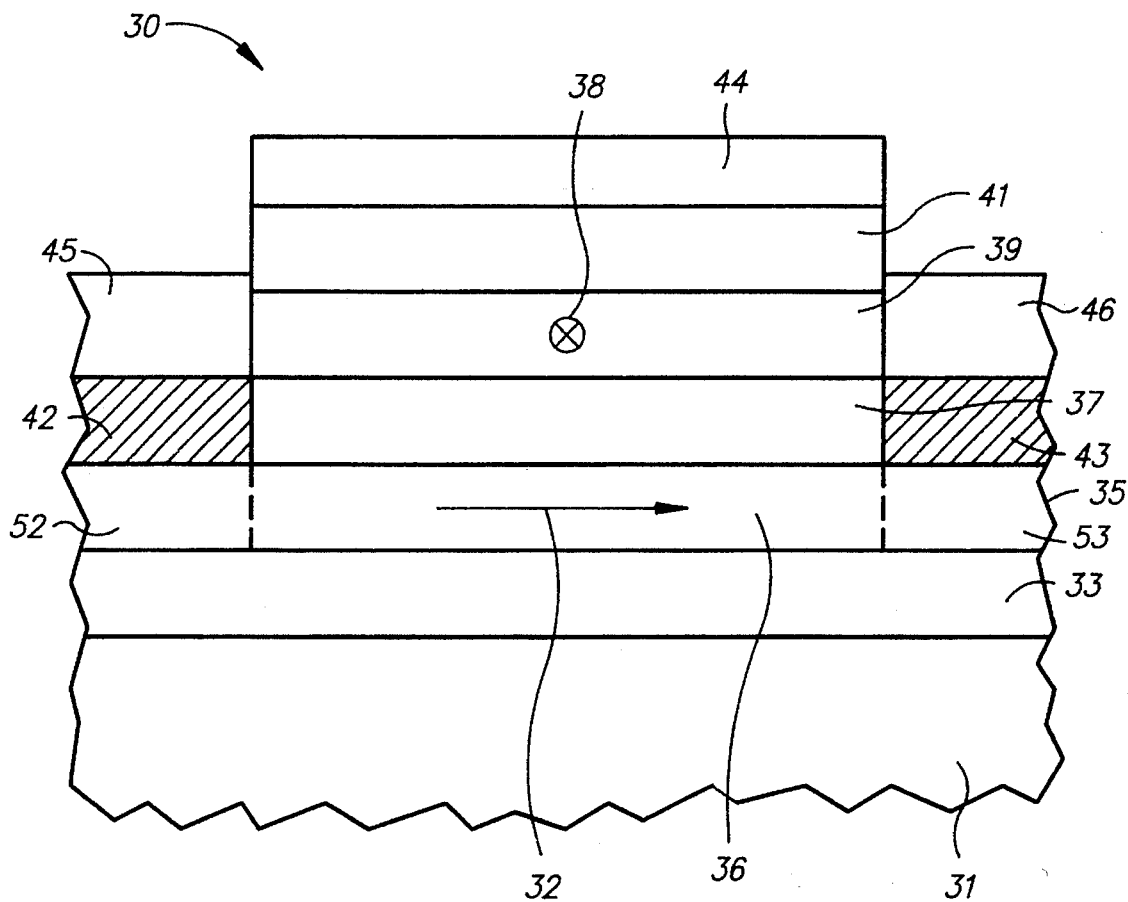
FIG. 4 is a view of the prior art SV sensor of FIG. 3 as seen from the disk and also showing the capping layer and electrical leads.

FIG. 4 is a view of the structure of FIG. 3 as it would appear looking up from the surface of disk 16 and shows the capping layer 44 and patterned electrical leads 45, 46 for making electrical connection to the sensor 30. FIG. 4 also shows the free layer 35 as one continuous film having a central active sensing region 36, represented as that portion between the dashed lines, and end regions or extensions 52, 53 located on the sides of central region 36. The extensions 52, 53 of free layer 35 on either side of region 36 are longitudinally biased by antiferromagnetic exchange layers 42, 43, respectively. The use of antiferromagnetic exchange coupling layers 41 and 42, 43 is the preferred method of pinning the magnetizations of the ferromagnetic layer 39 and the extensions of free layer 35, respectively. The exchange bias layers 41 and 42, 43 are typically made of a suitable antiferromagnetic material, such as iron-manganese (Fe—Mn) or nickel-manganese (Ni—Mn). However, the layer 41 must be made of a different antiferromagnetic material from that used for the layers 42, 43. This is because the magnetization of layer 41 must be made perpendicular to the magnetizations of layers 42, 43. During processing, the antiferromagnetic material is subjected to an applied magnetic field while heated to a specific critical temperature to orient its magnetization. Different antiferromagnetic materials must be selected so that when one material is raised to its temperature to orient its magnetization, this temperature will be below the critical temperature of the other material and its magnetization will be unaffected.

The use of a continuous film free ferromagnetic layer, where the central sensing region and the extensions or end regions are part of the continuous film, presents several disadvantages in fabricating a SV sensor. The principal problem is the ability to reproducibly etch away the end regions of the spacer layer 37, the pinned ferromagnetic layer 39, and the exchange biasing layer 41 without attacking or artificially reducing the thickness of the end regions 52, 53 of the free ferromagnetic layer. Most etching techniques like ion milling or sputter etching have uniformity removal characteristics of 10 percent. The three layers that must be removed have typical approximate thicknesses of 25 Å for the spacer, 60 Å for the pinned ferromagnetic layer, and 150 Å for the exchange layer, or a total of about 250 Å. With an uncertainty of 10 percent in material removal, the free layer, with a typical thickness of 50 Å, could be reduced in thickness by almost 50 percent to 25 Å. This would diminish the longitudinal biasing of the end regions 52, 53 since the net magnetic moment contained in the end regions should be comparable to the net magnetic moment in the central active region 36 of the sensor to produce a stable bias condition. Alternatively, one could approach the fabrication of the prior art spin valve by using additive processing. In this case, after depositing the free ferromagnetic layer, photoresist with openings for the active region of the sensor could be overlayed onto the free layer. Then the spacer layer, the pinned ferromagnetic layer, and the exchange layer could be deposited onto the photoresist and the open areas of the free layer and then the material lifted off of the free layer by dissolving the photoresist. This additive process requires two separate depositions to form the active region of the sensor. In particular, the interface between the free ferromagnetic layer and the spacer layer would be formed in two separate deposition steps, and the quality of this interface is reduced from the more ideal interface which is formed in a single vacuum step. A poor interface will result in lower resistance change in the sensor. The use of a continuous free layer for both the end regions and the active region of the sensor also precludes the use of separate and distinct ferromagnetic materials for these regions. In some cases, it may be more advantageous to use different compositions of Ni—Fe in the end regions than in the central region to maximize the exchange amplitude. In some cases, it may also be advantageous to have different thicknesses of ferromagnetic material (or different net moments) in the end regions and in the central region.

The above-described embodiment is for a SV sensor used in a magnetic recording system, such as a disk drive. However, the SV element of the present invention is also applicable for use in magnetic random access memory systems. In such an embodiment, the SV element serves as a bit cell and the magnetizations of the free and pinned layers would be oriented antiparallel, rather than perpendicular.

PREFERRED EMBODIMENTS

Figure 5:
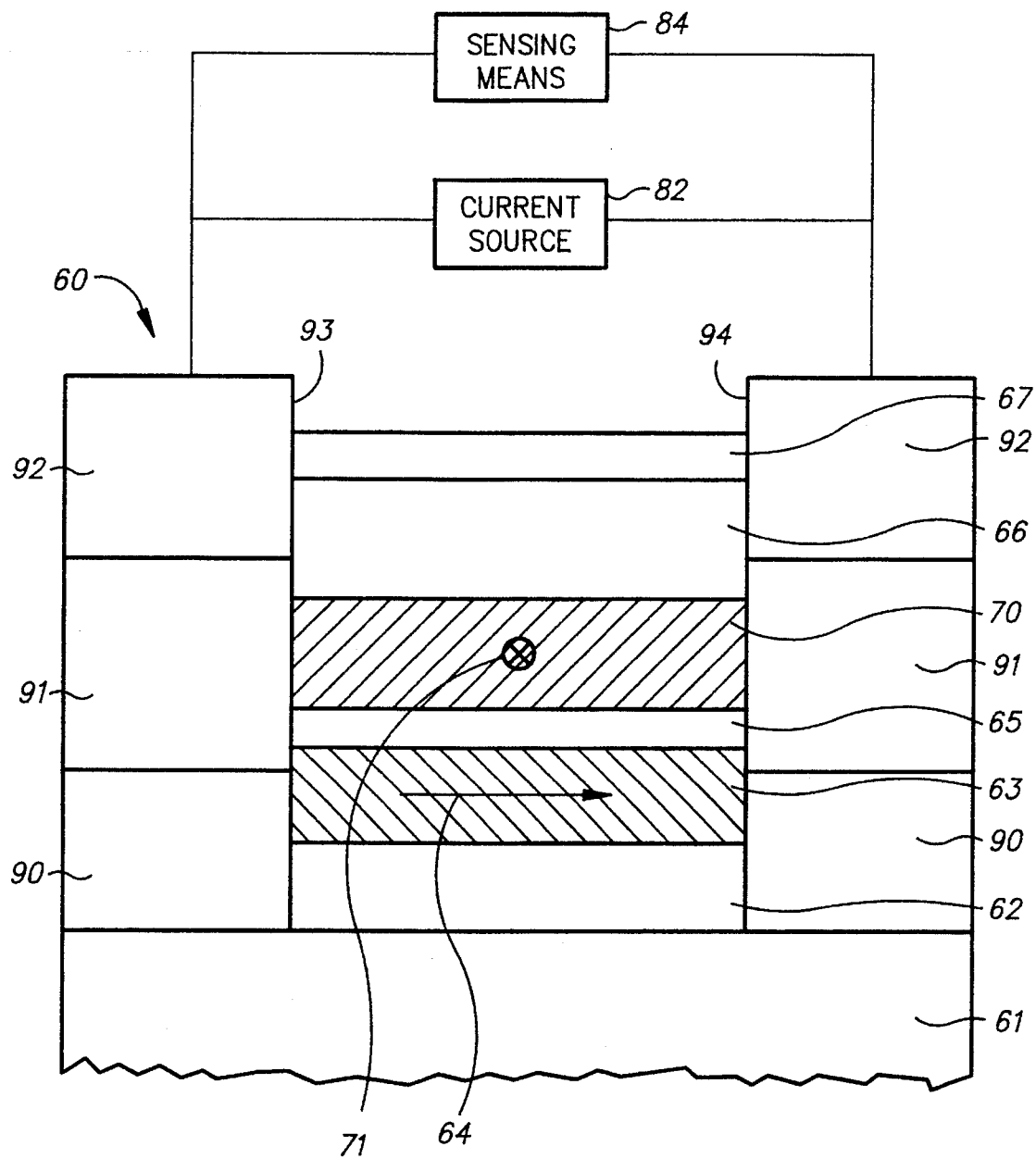
FIG. 5 is a view of the SV sensor according to the present invention as seen from the disk.

The preferred embodiment of the spin valve structure according to the present invention is shown schematically in FIG. 5. Like the prior art sensor 30 of FIG. 4, the SV sensor 60 is shown as it would appear looking up from the magnetic medium, such as disk 16. A layer of tantalum (Ta) as a buffer layer 62 is formed onto a substrate 61. Next, a Ni—Fe free ferromagnetic layer 63 is formed over the buffer layer 62, followed by a copper (Cu) spacer layer 65. The Ni—Fe in free layer 63 may have a composition in the range of $Ni_{80}Fe_{20}$ to $Ni_{85}Fe_{15}$. The pinned ferromagnetic layer 70 is formed over the spacer layer 65, followed by an Fe—Mn antiferromagnetic layer 66 to exchange couple with the Ni—Fe pinned layer 70. A capping layer 67 is formed over the Fe—Mn layer 66. The free layer 63 has its magnetization oriented in the direction of arrow 64 in the absence of an external magnetic field. The pinned layer 70 has its magnetization pinned in the direction of arrow 71 (into the paper in FIG. 5) by means of its exchange coupling with antiferromagnetic layer 66. The layers 62, 63, 65, 70, 66, and 67 have a width defined by edges 93, 94. This width is selected to be essentially the desired track width for the magnetic medium. Since this width is in the micron (10,000 Å) range and the thickness of the layers is in the 10–100 Å range, the drawing of FIG. 5 is not made to scale so that the sensor films can be properly shown.

A layer 90 of Ni—Fe is formed on both sides of free layer 63 and abuts the edges 93, 94. A layer 91 of Ni—Mn is formed on and in contact with layer 90 and exchange couples with layer 90 so that the magnetization of the Ni—Fe in the tail or end regions is maintained generally in the direction parallel to arrow 64. Thus, the free layer 63 and its lateral tails or extensions in layer 90 form the first ferromagnetic layer of the SV sensor 60. In the presence of an applied magnetic field from the magnetic medium, the magnetization of layer 63 is free to rotate, while the magnetization in the end regions in layer 90 remains essentially fixed. A layer of conductive material is formed on layer 91 to serve as the electrical leads 92 for the SV sensor 60.

While the embodiment shown in FIG. 5 has the free layer 63 located closer than the pinned layer 70 to the substrate 61, it is also possible to form the SV sensor 60 in an inverted manner, i.e., with the pinned layer closer to the substrate. In that structure, the antiferromagnetic layer 66 for pinning the pinned layer 70 would be located between the substrate 61 and the pinned layer 70. The Ni—Mn layer 91 and the Ni—Fe end regions 90 could also be reversed so that the antiferromagnetic material 91 is deposited first, followed by the ferromagnetic layer 90.

FIG. 5 also illustrates schematically the means for connecting the SV sensor 60 to sensing circuitry in the magnetic recording system. The electrical leads 92 are provided to form a circuit path between the SV sensor 60 and a current source 82 and a sensing means 84. A magnetic signal in the medium is sensed by the sensing means 84 detecting the change in resistance as the magnetization of the free ferromagnetic layer 63 rotates in response to the applied magnetic signal from the recorded medium.

Figure 6A:
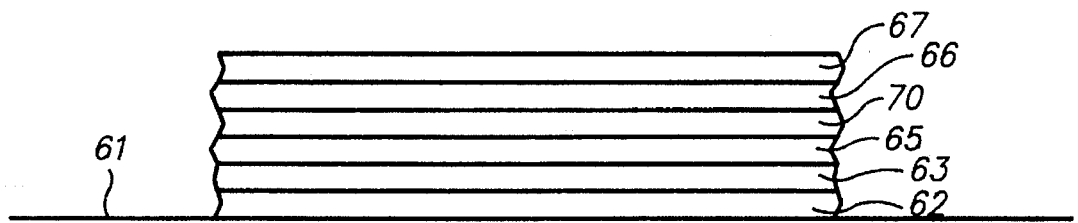
FIGS. 6A–6D are illustrations of the steps involved in the fabrication of the SV sensor shown in FIG. 5.

The fabrication steps for the SV sensor 60 will be explained with reference to FIGS. 6A–6D. As shown in FIG. 6A, a series of layers are first sputter deposited onto a substrate 61 during a single pumpdown. The substrate 61 may be glass, semiconductor material, or a ceramic material, such as an alumina ($Al_2O_3$)/titanium-carbide (TIC) ceramic material used for conventional sliders. The films formed in sequence onto substrate 61 include a 50 Å tantalum (Ta) underlayer or buffer layer 62, a 60Å permalloy Ni—Fe free ferromagnetic layer 63, a 25 Å copper (Cu) spacer layer 65, an 80 Å permalloy pinned ferromagnetic layer 70, a 150 Å Fe—Mn exchange bias layer 66 for pinning the pinned layer 70, and a 100 Å Ta capping layer 67.

Figure 6B:
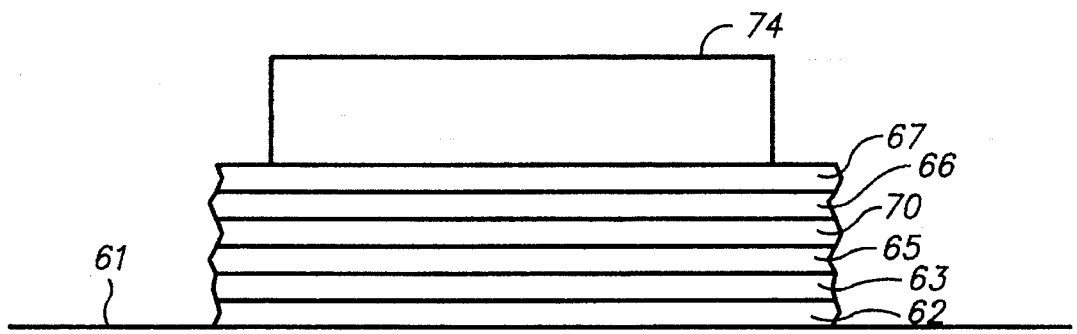

Next, as shown in FIG. 6B, photoresist 74 is patterned over these layers to form a rectangularly-shaped region. The layers are ion milled and the photoresist is removed.

Figure 6C:
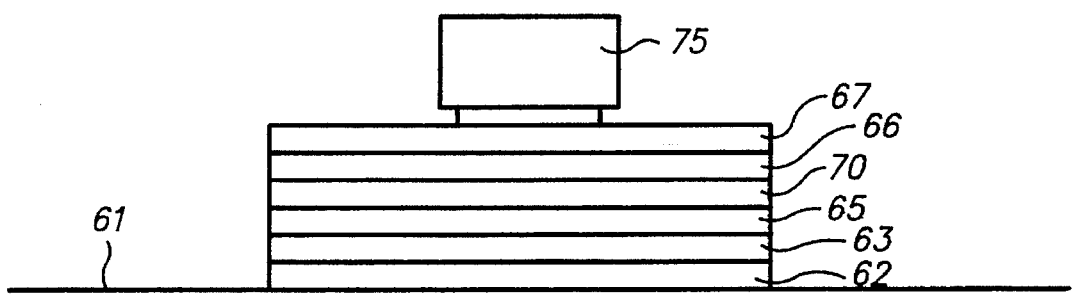

Next, as shown in FIG. 6C, photoresist 75 is patterned over these layers to a width corresponding to the desired track width for the SV sensor 60. The photoresist layer 75 is bilayer in nature with an undercut. The undercut allows for subsequent liftoff of the end region metal layers and allows the end region metals to slightly overlap the capping layer 67.

Figure 6D:
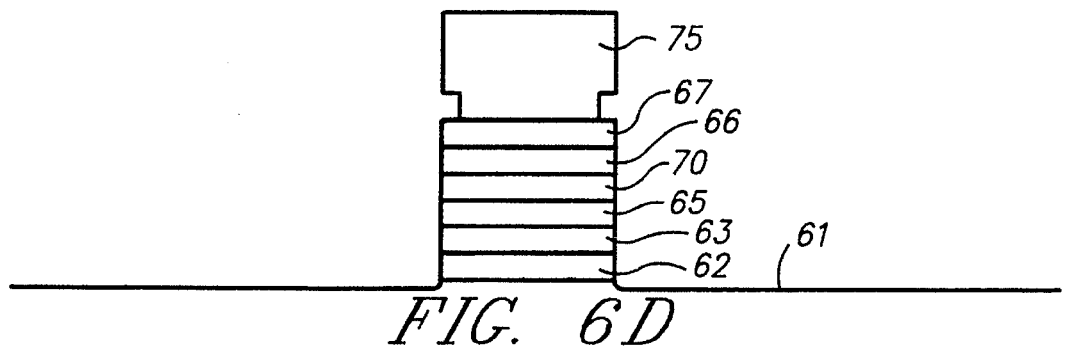

As shown in FIG. 6D the remaining portions of the layers that are not protected by the photoresist 75 are etched or removed by ion milling. Since ion milling uniformity is typically 10 percent, the ion milling time is selected to be greater than 10 percent of the total time to remove the layers. The stopping point of the ion milling etching is in the substrate 61, and therefore all the material in the end regions is removed. As can be seen in FIG. 6D, the removal of all the material in the end regions is assured by ion milling slightly into the substrate 61.

Figure 6E:
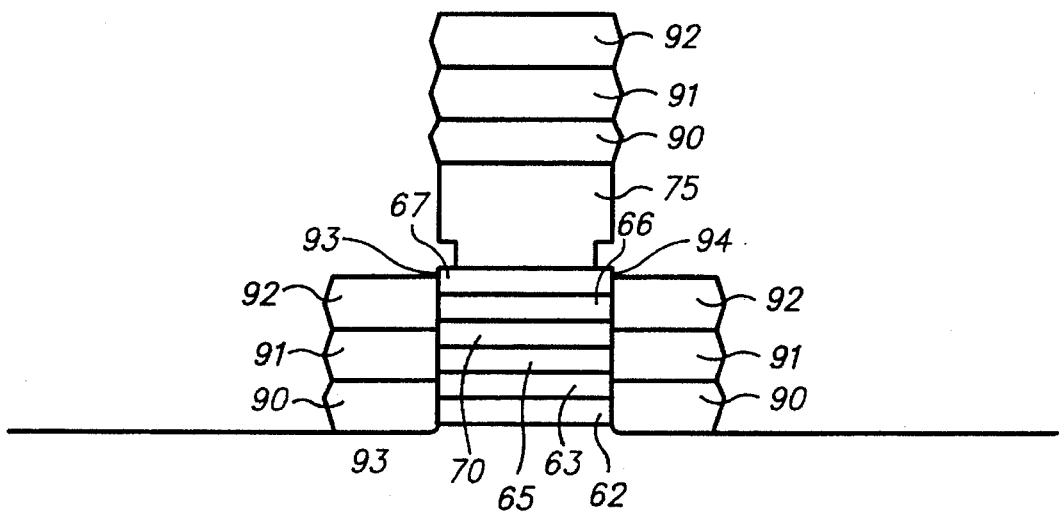

Next, as shown in FIG. 6E, a layer 90 of ferromagnetic material, usually Ni—Fe, but not necessarily the same Ni—Fe composition as the Ni—Fe in the active region of the SV sensor, is deposited. This is followed by 300 Å of Ni—Mn as exchange bias layer 91. A sequence of layers is then deposited to serve as electrical lead layer 92. Layer 92 is preferably formed of a sequence of sputter-deposited layers of Ta, gold (Au), and Ta. Layers 90, 91, 92 also overlay resist layer 75. The ferromagnetic free layer 63 is the central active sensing region with edges 93, 94 that are spaced apart to form the desired track width of the SV sensor 60. Layer 90 is deposited to a thickness so that the net magnetic moment of layer 90 is approximately 10–30 percent greater than the net magnetic moment of the free layer 63. Thus, if layer 90 is the same material composition as layer 63 then layer 90 would be formed 10–30 percent thicker than the thickness of free layer 63. The antiferromagnetic layer 91 is then sequentially deposited over layer 90, preferably during the same vacuum pumpdown sequence.

Figure 6F:
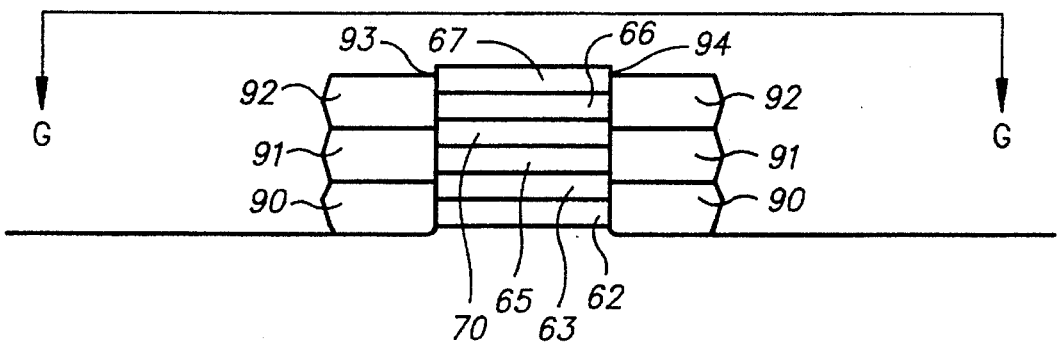

The resist layer 75 is then dissolved, removing the overlaying layers and leaving the sensor structure shown in FIG. 6F.

Layer 90 may also be formed of a ferromagnetic material different from free layer 63 or from a Ni—Fe composition different from free layer 63. In some applications, the free layer Ni—Fe composition is optimized for magnetostriction issues and this composition need not be useful for optimized Ni—Mn exchange strength. In some applications, the free layer in the active region may not be Ni—Fe, but rather a Ni—Fe/Co layered structure. In this case, ferromagnetic layer 90 need not be a Ni—Fe/Co layered structure as well, but a Ni—Fe layer could be used. The criteria for end region stabilization is that the net magnetic moment of the end region ferromagnetic layer be equivalent to 10–30 percent or greater than the net magnetic moment of the free layer ferromagnetic layer in the central active region.

The advantages of the abutted approach for longitudinally biasing the SV sensor are in implementation and material flexibility. The abutted approach allows the complete removal of all layers in the end regions of the sensor, and then the deposition of the ferromagnetic layer and the exchange layer in one sequential vacuum cycle. The abutted approach allows for tailoring the thickness of the ferromagnetic layer and the material of the ferromagnetic layer to optimize the exchange strength of the end region ferromagnetic/antiferromagnetic layers.

Figure 6G:
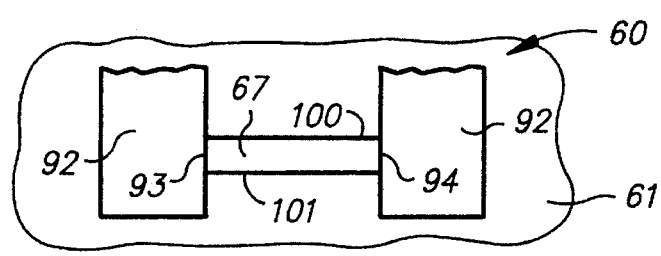

FIG. 6G is a top view in the direction of view G—G of FIG. 6F for illustrating the manner in which the completed SV sensor 60 is formed on substrate 61. Photoresist layer 74 (FIG. 6B) defines edges 100 and 101 of sensor 60. Photoresist layer 75 (FIG. 6E) defines edges 93 and 94 of the sensor 60. The top layer in the tail or end region is layer 92, the lead material layer, and the top layer in the sensor region is layer 67, the capping layer. After resist layer 75 is removed, the sensor 60 is encapsulated by sputter depositing approximately 0.5 microns of alumina onto the substrate 61.

The alumina-encapsulated sensor 60 is then placed in an annealing oven and heated to a temperature of approximately 240° C. in the presence of an applied magnetic field. The sensor is oriented in the oven such that the applied magnetic field is in the direction indicated by arrow 64 (FIG. 5). The Ni—Mn layer 91 is not antiferromagnetic at room temperature, but when heated becomes antiferromagnetic. Its magnetization becomes aligned along the magnetization direction of Ni—Fe layer 90, which is aligned with the applied field. This direction is essentially parallel to the magnetization direction 64 of the central region of free layer 63. After cooling, the magnetization of the Ni—Mn layer 91 becomes permanently set and provides antiferromagnetic exchange coupling for layer 90 in the end regions. These end regions will then be permanently magnetized in the direction indicated by arrow 64.

After cooling, the sensor is then rotated 90 degrees in the same annealing oven. Unlike Ni—Mn, the Fe—Mn layer 66 is antiferromagnetic as deposited. However, its magnetization must be realigned so that it can exchange couple the pinned layer 70 in the proper orientation. The temperature is raised in the oven to approximately 180° C., which is greater than the Neel temperature of Fe—Mn. At this temperature, Fe—Mn is no longer antiferromagnetic and has no magnetization history so that upon subsequent cooling, its magnetization will grow in the proper direction. Since the applied magnetic field is oriented parallel to the magnetization direction 71 of the pinned layer 70, the magnetization of Fe—Mn layer 66 will also be aligned along that direction. The applied magnetic field from the annealing oven thus prepares the pinned layer 70 to have the appropriate direction 71 (FIG. 5) and upon subsequent cooling below the Neel temperature of Fe—Mn, the Fe—Mn will have its magnetization aligned with that of the pinned layer 70. The result is that the Fe—Mn layer 66 now forms an antiferromagnetic exchange-coupled layer to pin the direction of magnetization of pinned layer 70. Thus, in the presence of an applied sensing field, the magnetization of the pinned layer 70 will not rotate. Because the Neel temperature of Ni—Mn is approximately 450° C., which is considerably higher than the 160° C. Neel temperature of Fe—Mn, the magnetization direction of the Ni—Mn layer 91 will be unaffected and will remain oriented generally parallel to that of Ni—Fe layers 90 and 63.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A spin valve magnetoresistive element comprising:

a substrate;

a central active layered structure formed on the substrate and comprising:

a free layer of central active region ferromagnetic material having a magnetization orientation in the absence of an applied magnetic field, a metallic nonmagnetic spacer layer adjacent to and in physical contact with the free ferromagnetic layer central active region, a pinned ferromagnetic layer adjacent to and in physical contact with the spacer layer and having a magnetization oriented at an angle to the magnetization of the free ferromagnetic layer central active region, and a layer of a first type of antiferromagnetic material formed adjacent to and in physical contact with the pinned ferromagnetic layer for pinning the magnetization of the pinned ferromagnetic layer, the free layer central active region, spacer layer, pinned layer and first antiferromagnetic material layer having substantially the same width and common side edges; and a longitudinal biasing end region layered structure formed on the substrate abutting and in physical contact with the side edges of the central active layered structure and comprising:

a layer of end region ferromagnetic material abutting and in physical contact with the side edges of the free layer central active region and a layer of a second type of antiferromagnetic material having a composition different from the composition of said first type of antiferromagnetic material and being formed on and in physical contact with said end region ferromagnetic layer for longitudinally exchange biasing the magnetization in the end region ferromagnetic layer.

2. A spin valve magnetoresistive element as in claim 1 wherein the second antiferromagnetic material is formed of an alloy comprising nickel and manganese.

3. A spin valve magnetoresistive element as in claim 2 wherein the first antiferromagnetic material is formed of an alloy comprising iron and manganese.

4. A spin valve magnetoresistive element as in claim 1 wherein the second antiferromagnetic material abuts and is in physical contact with the side edges of the free layer central active region.

5. A spin valve magnetoresistive element as in claim 1 wherein the ferromagnetic material in the free layer central active region has a composition different from the composition of the ferromagnetic material in the end region ferromagnetic layer.

6. A magnetic storage system comprising:

a magnetic storage medium having a plurality of tracks for the recording of data;

a magnetic transducer maintained close to the magnetic storage medium during relative motion between the magnetic transducer and the magnetic storage medium, the magnetic transducer including a spin valve magnetoresistive sensor comprising (a) a substrate; (b) central active layered structure formed on the substrate and comprising a free layer of central active region ferromagnetic material having a magnetization orientation in the absence of an applied magnetic field, a metallic nonmagnetic spacer layer adjacent to and in physical contact with the free ferromagnetic layer central active region, a pinned ferromagnetic layer adjacent to and in physical contact with the spacer layer and having a magnetization oriented at an angle to the magnetization of the free ferromagnetic layer central active region, and a layer of a first type of antiferromagnetic material formed adjacent to and in physical contact with the pinned ferromagnetic layer for pinning the magnetization of the pinned ferromagnetic layer, the free layer central active region, spacer layer, pinned layer and first antiferromagnetic material layer having substantially the same width and common side edges; and (c) a longitudinal biasing end region layered structure formed on the substrate abutting and in physical contact with the side edges of the central active layered structure and comprising a layer of end region ferromagnetic material abutting and in physical contact with the side edges of the free layer central active region and a layer of a second type of antiferromagnetic material having a composition different from the composition of said first type of antiferromagnetic material and being formed on and in physical contact with said end region ferromagnetic layer for longitudinally exchange biasing the magnetization in the end region ferromagnetic layer; and means coupled to the magnetoresistive sensor for detecting resistance changes in the magnetoresistive sensor responsive to magnetic fields representative of data bits recorded in the magnetic storage medium intercepted by the magnetoresistive sensor.

7. A system as in claim 6 wherein the second antiferromagnetic material is formed of an alloy comprising nickel and manganese.

8. A system as in claim 6 wherein the second antiferromagnetic material abuts and is in physical contact with the side edges of the free layer central active region.

9. A system as in claim 6 wherein the composition of the ferromagnetic material in the central active region is different from the composition of the ferromagnetic material in the end ferromagnetic layer.

* * * * *